(12) United States Patent
Fukuda et al.

(10) Patent No.: US 6,865,003 B2
(45) Date of Patent: Mar. 8, 2005

(54) MULTIBEAM EXPOSURE HEAD AND MULTIBEAM RECORDING METHOD USING THE SAME

(75) Inventors: Takeshi Fukuda, Kanagawa (JP); Ichirou Miyagawa, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/699,742

(22) Filed: Nov. 4, 2003

(65) Prior Publication Data

US 2004/0090657 A1 May 13, 2004

(30) Foreign Application Priority Data

Nov. 6, 2002 (JP) ........................................ 2002-322561

(51) Int. Cl.$^7$ .............................................. G02B 26/08
(52) U.S. Cl. ........................ 359/204; 347/241; 347/242
(58) Field of Search ................................ 359/204, 900; 347/238, 241, 242, 243, 244; 385/120, 137

(56) References Cited

U.S. PATENT DOCUMENTS 6,771,299 B2 * 8/2004 Miyagawa ................... 347/241
2002/0101501 A1   8/2002 Miyagawa

FOREIGN PATENT DOCUMENTS

JP          2002-169113 A      6/2002

* cited by examiner

Primary Examiner—James Phan
(74) Attorney, Agent, or Firm—Sughrue Mion, PLLC

(57) ABSTRACT

The multibeam exposure head performs exposure recording on a recording material and includes a beam emitting unit having a plurality of beam emitting port rows each of which is formed by arranging a plurality of beam emitting ports at a predetermined interval in a row and an angle changing unit that changes a tilt angle of a row direction of the plurality of beam emitting port rows of the beam emitting. The angle changing unit performs switching between two exposure recording modes having different recording resolutions. The multibeam recording method uses the multibeam exposure head.

15 Claims, 7 Drawing Sheets

MULTIBEAM EXPOSURE HEAD AND MULTIBEAM RECORDING METHOD USING THE SAME

BACKGROUND OF THE INVENTION

1. Field of the Invention

The present invention relates to a multibeam exposure head with which multiple beams are imaged on a recording material such as a photoreceptor, a silver-halide or non-silver-halide photosensitive material, or a heat mode recording material by exposure, and a multibeam recording method using the multibeam exposure head.

2. Description of the Related Art

Conventionally, in the technical field of printing, lithographic plate making using a presensitized plate (PS plate) has widely been practiced. For instance, lithographic plate making for multicolor printing is performed in the manner described below: A color image is read using a scanner by decomposing into three colors of red (R), green (G), and blue (B). Image signals representing these three colors are converted into color-decomposed halftone-dot-signals for four colors of cyan (C), magenta (M), yellow (Y), and black (Bk). Printing on a photosensitive material called a "lith film" is performed for the respective colors by exposure to light beams modulated on the basis of the color-decomposed halftone-dot-signals for the respective colors to thereby obtain lithographic plates for the corresponding colors. Then, the thus obtained lithographic plates are used to print halftone dot images for the respective colors on PS plates by exposure, thus making printing plates for the four colors of C, M, Y, and Bk for lithographic printing.

In recent years, however, direct plate making and computer to plate (CTP) technology have been put into practical use and have received attention for simplifying a plate making process and reducing the time required for plate making. In the direct plate making and CTP, to make a printing plate for each of the four colors of C, M, Y, and Bk, direct drawing with a light beam such as a laser beam is performed on a PS plate, using the corresponding color-decomposed halftone-dot-signal obtained by a scanner system, and lith films are not used.

Also, in order to increase halftone levels and image quality of printed images, it is desired to increase a recording density. In addition, it is also desired to shorten the plate making time while increasing the recording density. Note that such high-density drawing in a short period of time is desired not only in the technical field of printing but also in various other fields of image recording.

As a technique for shortening the plate making time while increasing the recording density, there are known a multibeam exposure head and a multibeam exposure apparatus disclosed in commonly assigned JP 2002-169113 A, for instance. According to the prior art technique, optical fiber arrays are arranged in two rows so that an upper optical fiber array and a lower optical fiber array can cooperate with each other, and image recording by exposure is performed at a desired resolution while a recording material is moved relative to the optical fiber arrays, with the imaging magnification of an optical system being hardly changed.

According to the multibeam emitting unit disclosed in this prior art document, two optical fiber arrays are sandwiched between fixing members so as to be secured parallel and spaced apart from each other by a predetermined distance, and the positions at one end of beam emitting ports in one of the optical fiber arrays are displaced in a parallel arrangement direction with respect to the positions at the corresponding end of beam emitting ports in the other of the optical fiber arrays.

Also, with this technique, the parallel arrangement direction of the two optical fiber arrays is tilted with respect to a direction (subscanning direction) that is perpendicular to the relative moving direction of a recording material and a beam emitting direction, whereby recording on the recording material can be performed while switching among at least two recording pitches in the subscanning direction of the spots formed by multiple beams emitted from the optical fiber arrays on the recording material.

In particular, by satisfying a specific condition through appropriate settings of the distance between the two optical fiber arrays arranged parallel to each other and the shift amount between these optical fiber arrays in the parallel arrangement direction, an exposure condition having a target recording pitch can be obtained at the time of exposure on the recording material merely by rotating the two optical fiber arrays by a predetermined angle using an exposure head tilt angle changing device. The prior art head and apparatus are also advantageous in that multiple high-resolution exposure conditions can be set using a fine magnification adjustment lens.

The multibeam exposure head described above is capable of switching between a first exposure condition and a second exposure condition using the exposure head title angle changing device described above. Here, under the first exposure condition, each of multiple beams emitted from the upper one of the two optical fiber arrays arranged parallel to each other and each of multiple beams emitted from the lower one of the two optical fiber arrays are alternately arranged at equal intervals in the subscanning direction that is perpendicular to the beam emitting direction and a main scanning direction on the recording material. On the other hand, under the second exposure condition, the two optical fiber arrays are tilted about a rotation axis extending parallel to the multiple beam emitting direction described above so that each of the multiple beams emitted from the upper optical fiber array and each of the multiple beams emitted from the lower optical fiber array are alternately arranged in the subscanning direction at equal intervals that are different from the equal intervals under the first exposure condition.

With this multibeam exposure head, however, if the upper optical fiber array and the lower optical fiber array constituting the dual-stage construction are not arranged parallel to each other with high accuracy, variations occur in the recording pitch at which the recording material is exposed to the multiple beams at the time of scan-recording. As a result, image unevenness is generated as a defect.

That is, in order to perform recording of high quality images under both of the first exposure condition and the second exposure condition, it is required that each of the multiple beams emitted from the upper optical fiber array and each of the multiple beams emitted from the lower optical fiber array are arranged parallel to each other with high accuracy. However, it is extremely difficult to arrange them parallel to each other with high accuracy.

If the upper optical fiber array and the lower optical fiber array are sandwiched between the fixing members to be secured parallel to each other for the arrangement with higher parallel degree, a problem of cost increase may arise.

SUMMARY OF THE INVENTION

The present invention has been made in order to solve the problems described above, and its object is to provide a multibeam exposure head with which even if errors to some degree occur in the parallel accuracy between multiple beam emitting port rows that are each formed by arranging multiple beam emitting ports in a row at predetermined intervals and are arranged approximately parallel to each other, it is possible to suppress variations in the intervals between the beam emitting ports in a subscanning direction due to the parallel accuracy errors, thereby suppressing variations in an exposure recording pitch and suppressing the occurrence of image unevenness at the time of image recording.

The present invention also has another object to provide a multibeam recording method using the multibeam exposure head.

In order to attain the first object described above, the present invention provides a multibeam exposure head that performs exposure recording on a recording material that is relatively moved in a main scanning direction, comprising a beam emitting unit having a plurality of beam emitting port rows each of which is formed by arranging a plurality of beam emitting ports at a predetermined interval in a row, and an angle changing unit that changes a tilt angle of a row direction of the plurality of beam emitting port rows of the beam emitting unit with respect to a subscanning direction that is perpendicular to a beam emitting direction and the main scanning direction, wherein the angle changing unit has a function of performing switching between a first exposure recording mode and at least one other exposure recording mode, wherein the first exposure recording mode performs the exposure recording by setting the tilt angle at a first angle in such a way that a first scanning line group having a predetermined line interval and being formed on the recording material by multiple beams emitted from one of the plurality of beam emitting port rows, and at least one other scanning line group having the same line interval as the predetermined line interval and being formed on the recording material by multiple beams emitted from at least one other row of remainders of the plurality of beam emitting port rows are spaced apart from each other without superimposing, and each distance between adjacent scanning line groups becomes substantially equal to the predetermined line interval, and wherein at least one other exposure recording mode performs the exposure recording by setting the tilt angle at at least one other angle different from the first angle in such a way that each scanning line in at least one other scanning line group enters between adjacent scanning lines in the first scanning line group, and a line interval in a total scanning line group formed by at least one other scanning line group and the first scanning line group become a substantially equal interval.

Preferably, the first angle is set larger than at least one other angle. And, preferably, a recording resolution in the first exposure recording mode is set higher than a recording resolution in at least one other exposure recording mode.

In addition, it is preferable that the multibeam exposure head further comprises an optical system that converges the multiple beams emitted from the beam emitting unit on the recording material and adjusts an imaging magnification of an image to be recorded by the exposure recording.

Preferably, the beam emitting unit is constructed using optical fiber arrays.

Preferably, the beam emitting unit has a first beam emitting port row and a second beam emitting port row as the plurality of beam emitting port rows, and one of the plurality of beam emitting port rows is the first beam emitting port row and at least one other row of remainders of the plurality of beam emitting port rows is the second beam emitting port row; the first scanning line group is formed on the recording material by the multiple beams emitted from the first beam emitting port row and at least one other scanning line group is a second scanning line group being formed on the recording material by the multiple beams emitted from the second beam emitting port row, and the first exposure recording mode performs the exposure recording by setting the tilt angle at the first angle in such a way that the first scanning line group and the second scanning line group are spaced apart from each other without superimposing, and each distance between adjacent scanning line groups becomes substantially equal to the predetermined line interval; the total scanning line group is formed by the first scanning line group and the second scanning line group such that each scanning line in the second scanning line group enters between adjacent scanning lines in the first scanning line group and at least one other angle different from the first angle is a second angle, and at least one other exposure recording mode is a second exposure recording mode performing the exposure recording by setting the tilt angle at the second angle in such a way that and the line interval in the total scanning line group become the substantially equal interval; and the angle changing unit has the function of performing switching between the first exposure recording mode and the second exposure recording mode.

Preferably, the first angle is set larger than the second angle. And, preferably, a recording resolution in the first exposure recording mode is set higher than a recording resolution in the second exposure recording mode.

Moreover, in order to attain the above object, the present invention provides a multibeam exposure head that performs exposure recording on a recording material that is relatively moved in a main scanning direction, comprising a beam emitting unit having a plurality of beam emitting port rows that are arranged parallel to each other, each beam emitting port row being formed by arranging a plurality of beam emitting ports at a predetermined interval in a row, and an angle changing unit that changes a tilt angle of a row direction of each beam emitting port row of the beam emitting unit with respect to a subscanning direction that is perpendicular to a beam emitting direction and the main scanning direction, wherein the angle changing unit is a switching unit that performs switching between two exposure recording modes having different recording resolutions based on Equation (1) given below, $$n \times (\cos \theta\alpha) \times K = \cos \theta\beta \qquad (1)$$

where n is a number of the plurality of beam emitting port rows, $\theta\alpha$ is the tilt angle of the row direction of the beam emitting unit corresponding to a first recording resolution, $\theta\beta$ is the tilt angle of the row direction of the beam emitting unit corresponding to a second recording resolution, and K is a ratio between the first recording resolution and the second recording resolution.

Preferably, the angle changing unit sets the tilt angle of the row direction of the beam emitting unit at one of "$\theta\alpha$" and "$\theta\beta$" that respectively satisfy relationships expressed by Equations (2) and (3) given below, $$\tan \theta\alpha = ((m-1) \times p - q)/h \qquad (2)$$

$$\tan \theta\beta = (p/n - q)/h \qquad (3)$$

where m is a number of the plurality of beam emitting ports in each beam emitting port row of the beam emitting unit, n is a number of the plurality of beam emitting port rows, p is an equal interval between the plurality of beam emitting ports in each row in a direction in which the plurality of beam emitting ports are arranged, h is an equal interval between the plurality of beam emitting port rows in a direction in which the plurality of beam emitting port rows are arranged, q is an equal interval between the plurality of beam emitting ports in each beam emitting port row and the plurality of beam emitting ports in its adjacent beam emitting port rows in the arrangement direction of the plurality of beam emitting ports, and i is a number of lines by which overlapping of scanning lines for exposure recording occurs.

It is preferable that multibeam exposure head further comprises an optical system that converges multiple beams emitted from the beam emitting unit on the recording material and adjusts an imaging magnification of an image to be recorded by the exposure recording.

Preferably, the beam emitting unit is constructed using optical fiber arrays.

And, in order to attain the above object, the present invention provides a multibeam exposure head that performs exposure recording on a recording material that is relatively moved in a main scanning direction, comprising a beam emitting unit having a first beam emitting port row in which a plurality of beam emitting ports are arranged at a predetermined interval in a row, and a second beam emitting port row in which a plurality of beam emitting ports are arranged at the same interval in a row along the first beam emitting port row, and an angle changing unit that changes a tilt angle of a row direction of the first beam emitting port row and the second beam emitting port row with respect to a subscanning direction that is perpendicular to a beam emitting direction and the main scanning direction, wherein the angle changing unit has a function of performing switching between a first exposure recording mode and a second exposure recording mode, wherein the first exposure recording mode performs the exposure recording by setting the tilt angle at a first angle in such a way that a first scanning line group having a predetermined line interval and being formed on the recording material by multiple beams emitted from the first beam emitting port row, and a second scanning line group having the same line interval as the predetermined line interval and being formed on the recording material by multiple beams emitted from the second beam emitting port row are spaced apart from each other without superimposing, and each distance between adjacent scanning line groups becomes substantially equal to the predetermined line interval, and wherein the second exposure recording mode performs the exposure recording by setting the tilt angle at a second angle different from the first angle in such a way that each scanning line in the second scanning line group enters between adjacent scanning lines in the first scanning line group, and a line interval in a third scanning line group formed by the first scanning line group and the second scanning line group become a substantially equal interval.

In order to attain the second object, the present invention provides a multibeam recording method that uses a multibeam exposure head that performs exposure recording on a recording material that is relatively moved in a main scanning direction and comprises a beam emitting unit having a plurality of beam emitting port rows each of which is formed by arranging a plurality of beam emitting ports at a predetermined interval in a row, and an angle changing unit that changes a tilt angle of a row direction of the plurality of beam emitting port rows of the beam emitting unit with respect to a subscanning direction that is perpendicular to a beam emitting direction and the main scanning direction, the method comprising changing the tilt angle of the beam emitting unit using the angle changing unit to obtain a predetermined recording resolution, and performing the exposure recording at the predetermined recording resolution, wherein the angle changing unit has a function of performing switching between a first exposure recording mode and at least one other exposure recording mode, wherein the first exposure recording mode performs the exposure recording by setting the tilt angle at a first angle in such a way that a first scanning line group having a predetermined line interval and being formed on the recording material by multiple beams emitted from one of the plurality of beam emitting port rows, and at least one other scanning line group having the same line interval as the predetermined line interval and being formed on the recording material by multiple beams emitted from at least one other row of remainders of the plurality of beam emitting port rows are spaced apart from each other without superimposing, and each distance between adjacent scanning line groups becomes substantially equal to the predetermined line interval, and wherein at least one other exposure recording mode performs the exposure recording by setting the tilt angle at at least one other angle different from the first angle in such a way that each scanning line in at least one other scanning line group enters between adjacent scanning lines in the first scanning line group, and a line interval in a total scanning line group formed by at least one other scanning line group and the first scanning line group become a substantially equal interval.

Also, in order to attain the second object, the present invention provides a multibeam recording method that uses a multibeam exposure head that performs exposure recording on a recording material that is relatively moved in a main scanning direction and comprises a beam emitting unit having a plurality of beam emitting port rows that are arranged parallel to each other, each beam emitting port row being formed by arranging a plurality of beam emitting ports at a predetermined interval in a row, and an angle changing unit that changes a tilt angle of a row direction of each beam emitting port row of the beam emitting unit with respect to a subscanning direction that is perpendicular to a beam emitting direction and the main scanning direction, the method comprising changing the tilt angle of the beam emitting unit using the angle changing unit to obtain a predetermined recording resolution, and performing the exposure recording at the predetermined recording resolution, wherein the angle changing unit is a switching unit that performs switching between two exposure recording modes having different recording resolutions based on Equation (1) given below, $$n \times (\cos \theta\alpha) \times K = \cos \theta\beta \qquad (1)$$

where n is a number of the plurality of beam emitting port rows, $\theta\alpha$ is the tilt angle of the row direction of the beam emitting unit corresponding to a first recording resolution, $\theta\beta$ is the tilt angle of the row direction of the beam emitting unit corresponding to a second recording resolution, and K is a ratio between the first recording resolution and the second recording resolution.

DETAILED DESCRIPTION OF THE PREFERRED EMBODIMENTS

The present invention will be hereinafter described in detail based on embodiments illustrated in the accompanying drawings.

First Embodiment

First, a multibeam exposure apparatus using a multibeam exposure head according to a first embodiment of the present invention will be described.

Figure 1:
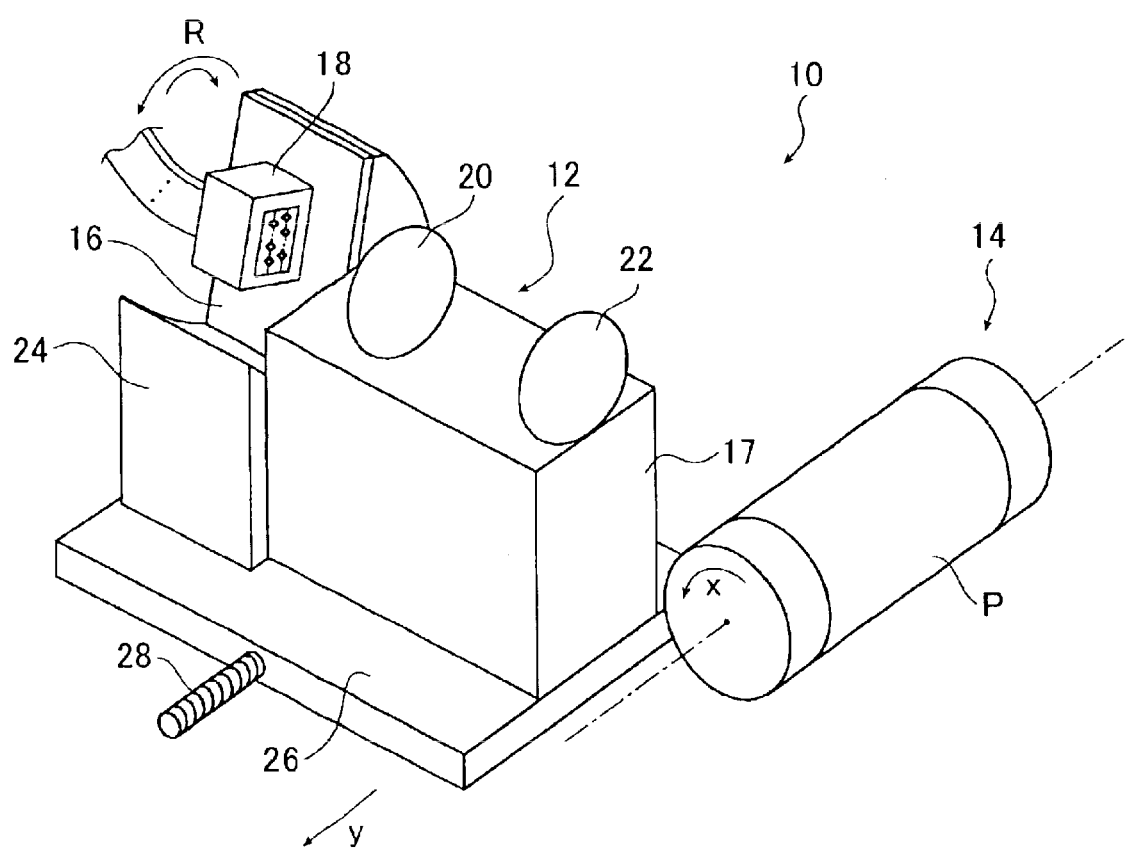
FIG. 1 is a schematic perspective view of a multibeam exposure apparatus using a multibeam exposure head according to a first embodiment of the present invention.

FIG. 1 is a schematic perspective view of a multibeam exposure apparatus (hereinafter simply referred to as "exposure apparatus") 10 using a multibeam exposure head 12 according to the first embodiment of the present invention.

The exposure apparatus 10 according to this embodiment emits multiple beams modulated in accordance with image signals so that the modulated multiple beams can be imaged on a recording material P such as a presensitized plate (PS plate) manufactured by Fuji Photo Film Co., Ltd. using an optical system to record an image by exposure. The exposure apparatus 10 mainly includes a multibeam exposure head 12 and an outer drum 14.

The multibeam exposure head 12 mainly includes a base 16, a multibeam emitting unit 18 fixed on the base 16, a collimator lens 20, an imaging lens 22, and an exposure head tilt angle changing device 24.

The multibeam emitting unit 18 is mounted on and fixed to the base 16 that is fixed on the exposure head tilt angle changing device 24. Note that the multibeam emitting unit 18 is rotatable in the directions of arrows R in FIG. 1.

The multibeam emitting unit 18 is a fiber array type light source formed of 64 optical fibers, and multiple beams enter the unit 18 from one end surface and exit from the other end surface through emitting ports that are flush with each other. The multiple beams are those of laser light emitted from a semiconductor laser device (not shown) such as a laser diode. ON/OFF statuses of the laser beams are controlled according to image signals. The laser beams enter the optical fibers through the end surfaces of the optical fibers that are coupled to laser light emitting surface of the semiconductor laser device through a semiconductor laser device/fiber coupling unit (not shown). Here, as shown in FIG. 2, the optical fiber arrays $FA_1$ and $FA_2$ of the multibeam emitting unit 18 are each fixed at a predetermined position by fixing members 18a, 18b, and 18c.

That is, the optical fiber arrays are of a so-called dual-stage construction which includes the optical fiber array $FA_1$ formed by arranging multiple optical fibers and the optical fiber array $FA_2$ formed by arranging the same number of optical fibers as the optical fiber array $FA_1$. In the optical fiber array $FA_1$, beam emitting ports are linearly arranged and fixed by the fixing member 18a and the fixing member 18c. On the other hand, in the optical fiber array $FA_2$, beam emitting ports are arranged and fixed substantially parallel to the direction of the arrangement of the beam emitting ports of the optical filter array $FA_1$ by the fixing member 18b and the fixing member 18c.

Figure 2:
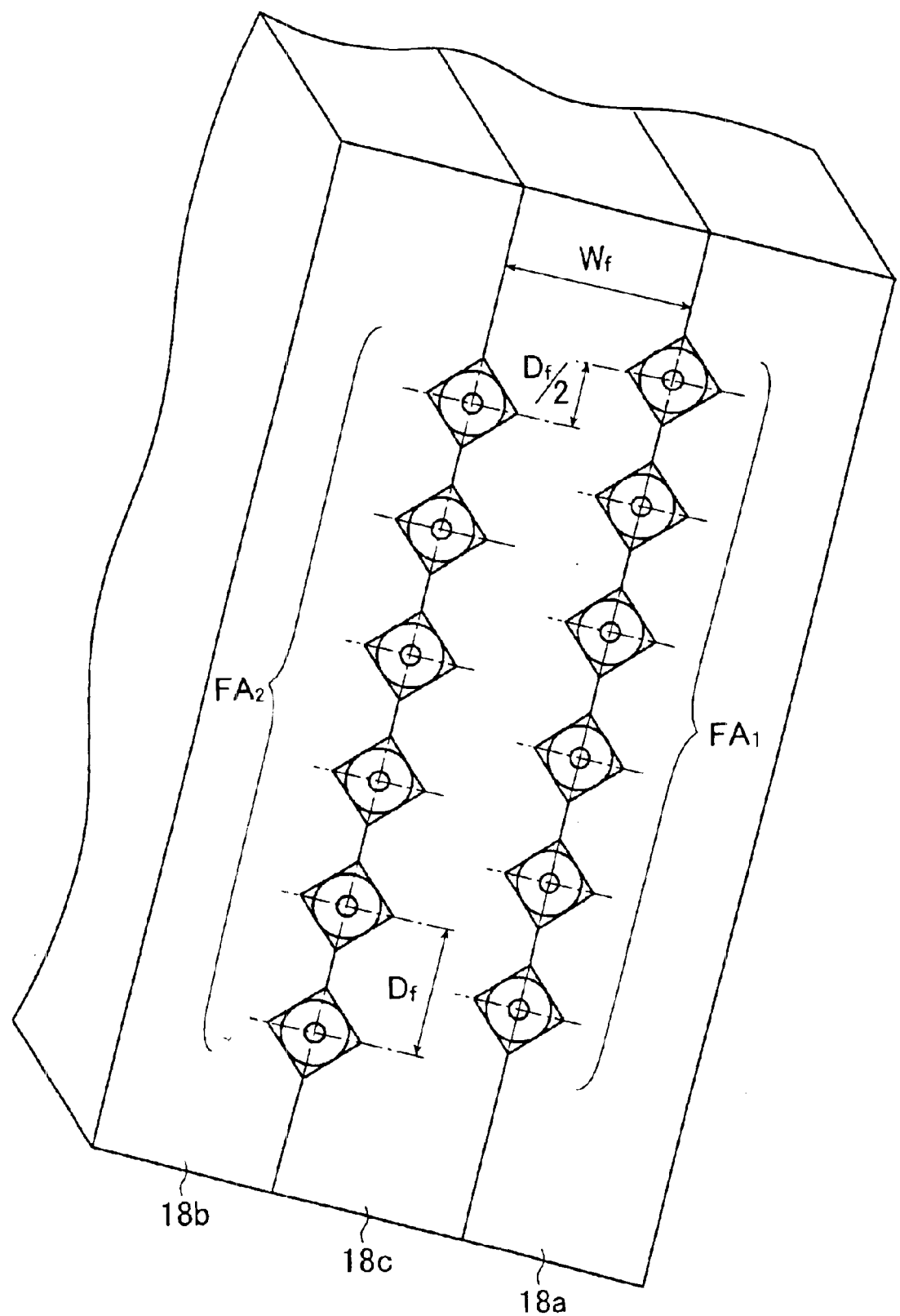
FIG. 2 is a schematic perspective view of an essential portion of the multibeam exposure head shown in FIG. 1.

As shown in FIG. 2, in the optical fiber array $FA_1$, the beam emitting ports are provided at regular intervals $D_f$ in the arrangement direction of the beam emitting ports. Also, in the optical fiber array $FA_2$, the beam emitting ports are provided at the same regular intervals $D_f$ in the arrangement direction. Further, the beam emitting ports of the optical fiber array $FA_1$ and the beam emitting ports of the optical fiber array $FA_2$ are alternately arranged at equal intervals in the arrangement direction. As a result, the regular intervals between (i) the beam emitting ports at one end of the optical fiber array $FA_1$ and (ii) the beam emitting ports at the corresponding end of the optical fiber array $FA_2$ in the parallel arrangement direction become "$D_f/2$". In addition, the distance (fiber array distance) between (i) the beam emitting ports of the optical fiber array $FA_1$ and (ii) the beam emitting ports of the optical fiber array $FA_2$ in a direction perpendicular to the arrangement direction is set as "$W_f$".

It should be noted here that in this embodiment, the beam emitting ports of the optical fiber array $FA_1$ and the beam emitting ports of the optical fiber array $FA_2$ are alternately arranged at the equal intervals in the arrangement direction of the beam emitting ports, as described above. However, the present invention is not limited to this, and there arises no problem so long as each beam emitting port of one of the optical fiber arrays $FA_1$ and $FA_2$ is arranged at least between two adjacent beam emitting ports of the other of the optical fiber arrays $FA_1$ and $FA_2$ in the arrangement direction. This is because, even in this case, it is possible to perform exposure recording of an image at a predetermined recording pitch by finely adjusting the arrangement directions of the beam emitting ports of the optical fiber array $FA_1$ and the optical fiber array $FA_2$ using the exposure head tilt angle changing device 24, as will be described later.

Referring again to FIG. 1, the collimator lens 20 and the imaging lens 22 are fixed to an optical system base 17, thereby forming a reduction optical system that images multiple beams finally reduced after having been emitted from the optical fiber array $FA_1$ and the optical fiber array $FA_2$ of the multibeam emitting unit 18. The optical system formed by the collimator lens 20 and the imaging lens 22 in this embodiment is not exclusively used. That is, in the present invention, any other reduction optical system may be used so long as it has the effect of reducing, at the imaging point, the multiple beams emitted from the multibeam emitting unit 18.

The outer drum 14 is a drum rotated in a main scanning direction, with a recording material P such as the PS plate described above, being fitted around its outer peripheral surface. The outer drum 14 is connected to a drive source (not shown) and is rotated at a predetermined rotational speed. Note that in this embodiment, the outer drum 14 is used as a device for performing main scanning on the recording material P, but the present invention is not limited to this, and it is also possible to use an exposure device of a flat bed type.

The exposure head tilt angle changing device 24 has a function of rotating, in each of the directions of the arrows R, the base 16 on which the multibeam emitting unit 18 is mounted and fixed. In more detail, the exposure head tilt angle changing device 24 rotates the base 16 about a rotation axis that passes through the center between the optical fiber array $FA_1$ and the optical fiber array $FA_2$ of the multibeam emitting unit 18 and extends parallel to the emitting direction of the multiple beams emitted from the optical fiber arrays, thereby tilting the multibeam emitting unit 18.

Figure 3:
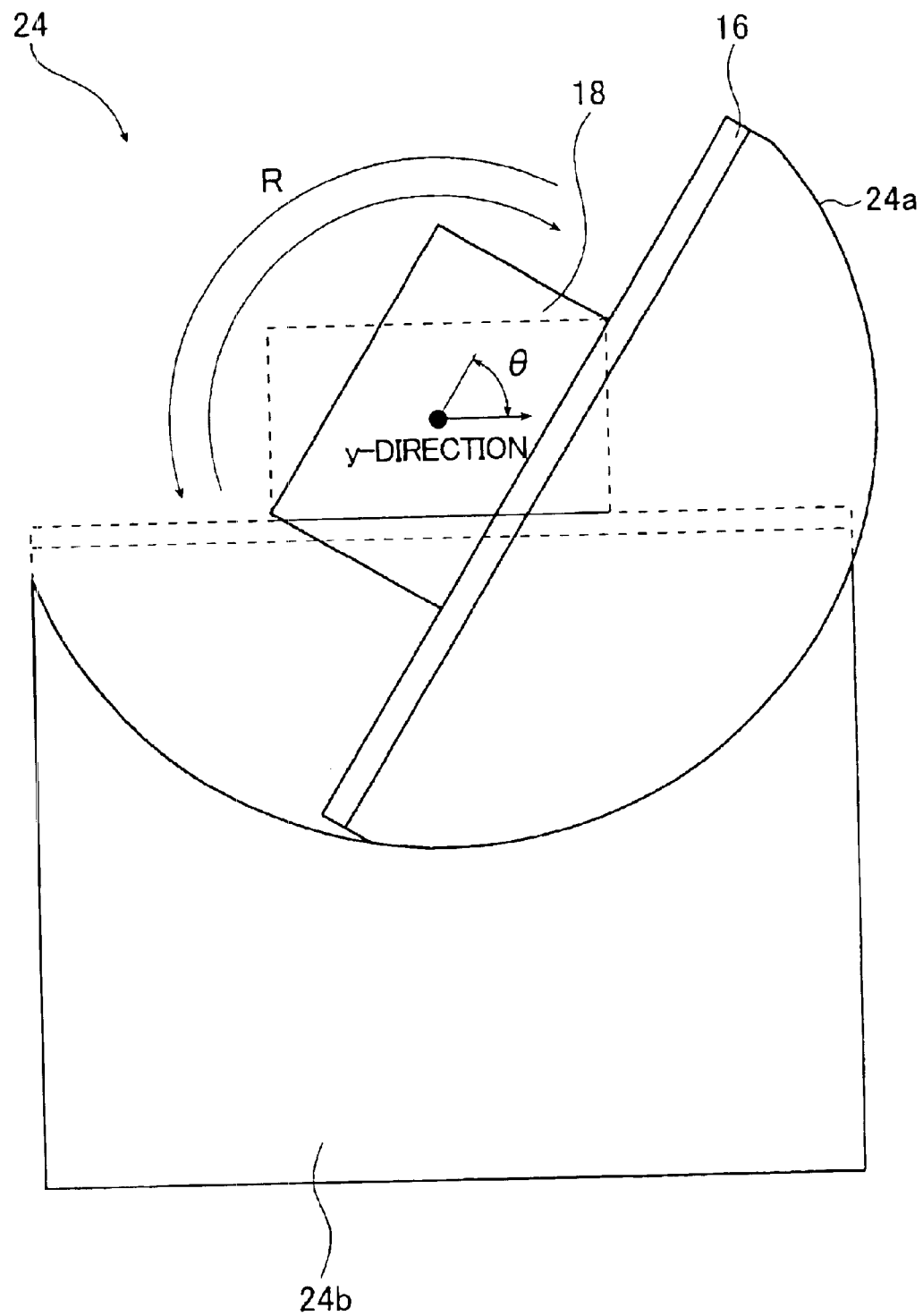
FIG. 3 is a diagram showing the construction of an exposure head tilt angle changing device used in the multibeam exposure head shown in FIG. 1.

FIG. 3 is a diagram schematically showing the construction of the exposure head tilt angle changing device 24 as viewed from a beam emitting port side of the multibeam emitting unit 18. As shown in this drawing, the exposure head tilt angle changing device 24 mainly includes a rotary unit 24a and a base unit 24b. The rotary unit 24a is freely rotatable in each of the directions of the arrows R described above with respect to the base unit 24b.

Here, a mechanism for rotating the rotary unit 24a is constructed using a well-known gear mechanism or the like so that the tilt angle can be set with accuracy. In order to change the tilt angle θ (fiber array tilt angle) of the beam emitting port rows of the optical fiber array $FA_1$ and the optical fiber array $FA_2$ of the multibeam emitting unit 18, the rotary unit 24a is rotated and is set at a predetermined tilt angle.

It should be noted here that the mounting surface of the base 16 shown in FIGS. 1 and 3, on which the multibeam emitting unit 18 is mounted, is tilted by the tilt angle θ (including 0°) with respect to the subscanning direction (y-direction in FIG. 3), so that the directions of the beam emitting port rows of the optical fiber array $FA_1$ and the optical fiber array $FA_2$ are also tilted by the tile angle θ with respect to the subscanning direction.

Here, when the multiple beams emitted from the beam emitting port row of the optical fiber array $FA_1$ perform exposure recording along a group of scanning lines arranged parallel to the main scanning direction at regular line intervals, and the multiple beams emitted from the beam emitting port row of the optical fiber array $FA_2$ performs exposure recording along another group of scanning lines that are arranged parallel to the main scanning direction at the same line intervals, the tilt angle θ is adjusted so that a recording range in which recording is performed by the optical fiber array $FA_1$, and a recording range in which recording is performed by the optical fiber array $FA_2$, do not overlap each other and are spaced apart from each other by a distance that is substantially equal to the line intervals in the scanning line groups described above (first exposure recording mode). Note that the line intervals in the scanning line groups each correspond to a recording pitch.

Here, referring again to FIG. 1, the exposure head tilt angle changing device 24 and the optical system base 17 are mounted and fixed on a movable table 26 that has a female thread into which a drive screw 28 connected to a rotary drive source (not shown) is screwed. With this construction, it is possible to move the base unit 24b in the y-direction (subscanning direction) shown in FIG. 1 by rotating the drive screw 28.

That is, the female thread of the movable table 26 and the drive screw 28 form a subscanning mechanism for integrally moving, in the y-direction described above, the exposure head tilt angle changing device 24, the multibeam emitting unit 18 mounted on the exposure head tilt angle changing device 24, and the collimator lens 20 and the imaging lens 22 fixed to the optical system base 17. That is, with the subscanning mechanism, the multibeam exposure head 12 is moved in the y-direction.

After the recording material P fitted around the outer drum 14 is exposed to the multiple beams emitted from the optical fiber array $FA_1$ and the optical fiber array $FA_2$ by making one round, the subscanning mechanism moves the multibeam exposure head 12 in the y-direction by a distance corresponding to the width of an area in the subscanning direction of the recording material P exposed to the light from the optical fiber array $FA_1$ and the optical fiber array $FA_2$.

Thus, exposure recording from end to end on the recording material P fitted around the outer drum 14 is performed in a so-called spiral manner with the multibeam exposure head 12. Note that the subscanning mechanism is not limited to the constitution in this embodiment where the drive screw 28 is combined with the female thread of the movable tale 26 into which the drive screw 28 is screwed, and it is possible to use any other mechanism so long as the movable table 26 can be moved in the y-direction described above.

As described above, both the intervals between the beam emitting ports of the optical fiber array $FA_1$ in their arrangement direction and the intervals between the beam emitting ports of the optical fiber array $FA_2$ in their arrangement direction are set at $D_f$. Also, the directions of the beam emitting port rows of the optical fiber array $FA_1$ and the optical fiber array $FA_2$ are tilted by the tilt angle θ with respect to the subscanning direction. Further, the interval (fiber array interval) in the subscanning direction between the beam emitting port row of the optical fiber array $FA_1$ and the beam emitting port row of the optical fiber array $FA_2$ is set so as to be equal to the beam emitting port intervals in the optical fiber array $FA_1$ or the optical fiber array $FA_2$. As a result, there is prevented a situation where the beam emitting ports of the optical fiber array $FA_1$ and the beam emitting ports of the optical fiber array $FA_2$ overlap each other in the subscanning direction. That is, there is obtained a situation where the beam emitting ports of the optical fiber array $FA_1$ and the beam emitting ports of the optical fiber array $FA_2$ are continuously arranged at the regular intervals. As a result, it becomes possible to perform exposure recording on the recording material P at the regular intervals in the subscanning direction.

Also, when the multibeam exposure head 12 is rotated in the direction R so that the directions of the beam emitting port rows of the optical fiber array $FA_1$ and the optical fiber array $FA_2$ coincide with the subscanning direction (y-direction in FIG. 1), each scanning line of the multiple beams emitted from the optical fiber array $FA_2$ is positioned at the center between two adjacent scanning lines of the multiple beams emitted from the optical fiber array $FA_1$. As a result, it becomes possible to perform exposure recording on the recording material P at regular scanning line intervals.

That is, each line in a scanning line group with which scanning with the multiple beams emitted from the optical fiber array $FA_2$ is performed is inserted between two adjacent lines in a scanning line group with which scanning with the multiple beams emitted from the optical fiber array $FA_1$ is performed, and scanning lines formed in these scanning line groups are arranged at approximately equal intervals (second exposure recording mode). Note that the scanning lines refer to straight lines along the main scanning direction (x direction in FIG. 1) when the recording material rotated (scanned) in the main scanning direction is exposed to the multiple beams.

At this time, switching between the first exposure recording mode and the second exposure recording mode described above is performed by rotating the multibeam emitting unit 18 using the exposure head tilt angle changing device 24. The tilt angle θ in the first exposure recording mode is set larger than the tilt angle θ in the second exposure recording mode.

Also, the exposure recording resolution in the first exposure recording mode is set higher than the exposure recording resolution in the second exposure recording mode. As a result, the first exposure recording mode adopts a condition for high-resolution exposure, and the second exposure recording mode adopts a condition for low-resolution exposure.

As described above, with the multibeam exposure head 12 according to this embodiment, it is possible to perform exposure recording of an image at high resolution or low resolution by rotating the multibeam exposure head 12 and to perform switching between the two resolutions with efficiency. That is, it is possible to freely perform switching from the high-resolution exposure condition to the low-resolution exposure condition or switching from the low-resolution exposure condition to the high-resolution exposure condition.

Figure 4:
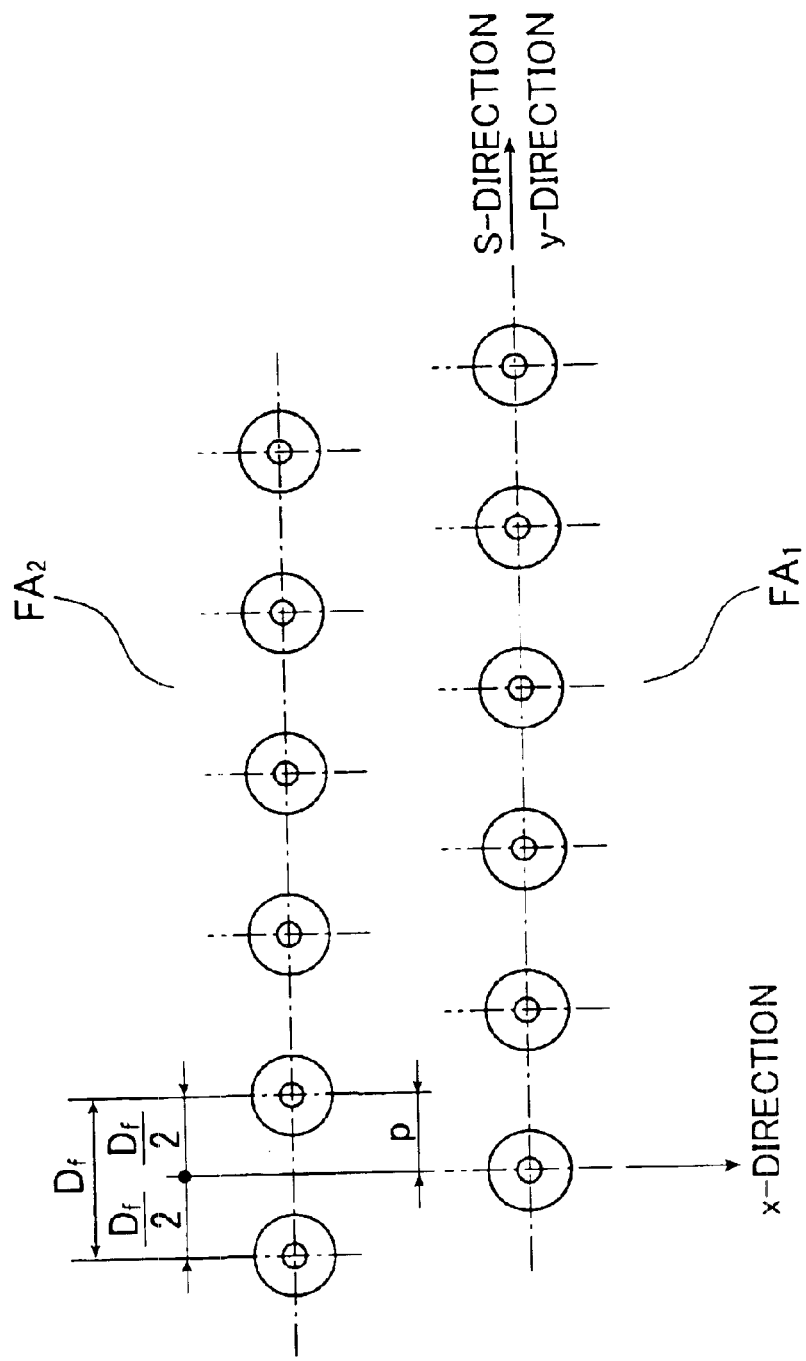
FIG. 4 illustrates how optical fiber arrays are arranged in the multibeam exposure head shown in FIG. 1.
Figure 5:
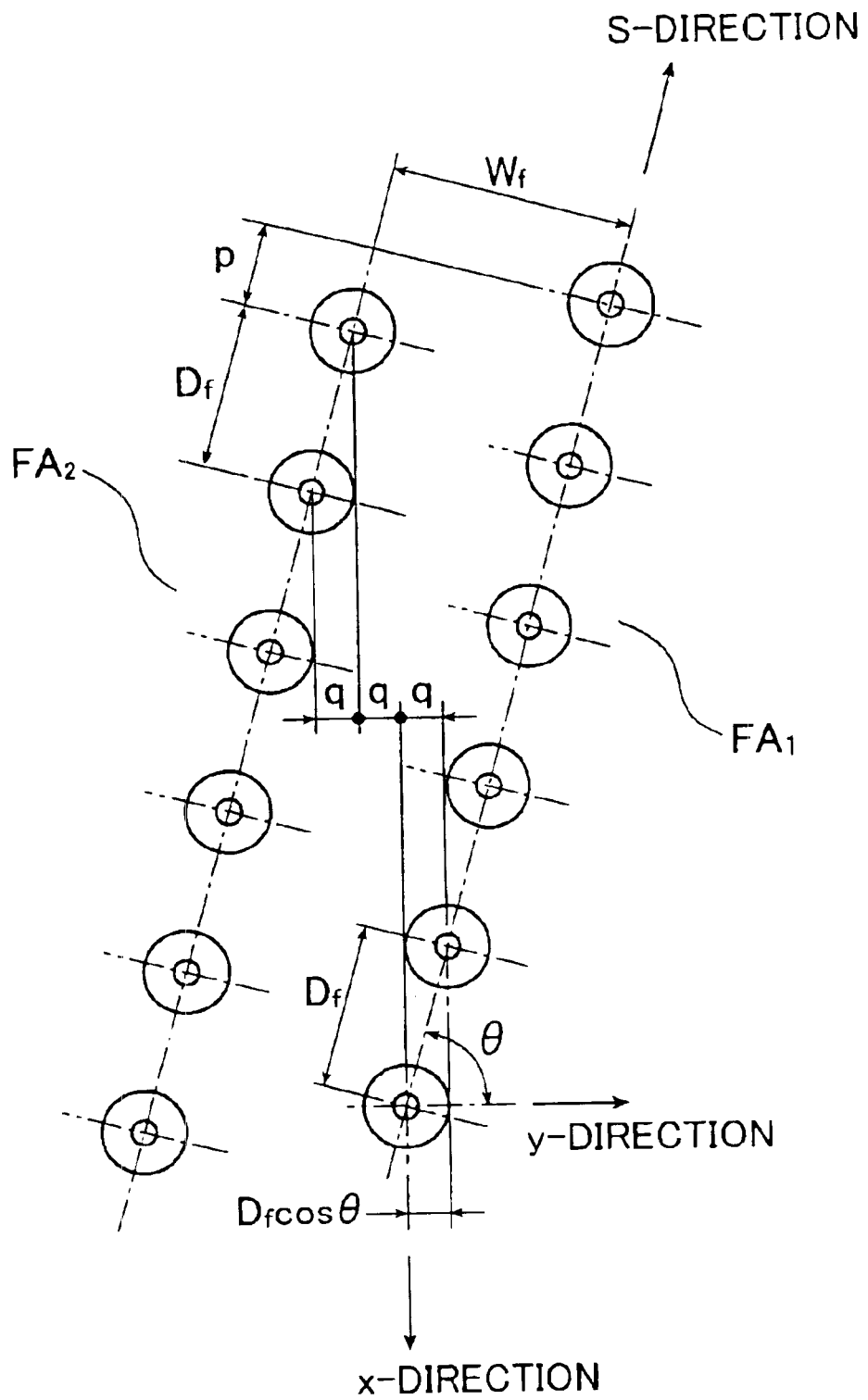
FIG. 5 illustrates how the optical fiber arrays are arranged under a state where the multibeam exposure head shown in FIG. 1 is tilted.

For instance, by performing switching from the low-resolution exposure condition to the high-resolution exposure condition, it is possible to perform switching of the exposure recording resolution on the recording material P without changing an imaging magnification. Here, as shown in FIG. 4, under the low-resolution exposure condition, the arrangement directions (S-directions) of the beam emitting ports of the optical fiber array $FA_1$ and the optical fiber array $FA_2$ are set at the subscanning direction (y-direction), and the intervals between the beam emitting ports in the y-direction (line intervals in the scanning line groups) are set at equal intervals "p". On the other hand, as shown in FIG. 5, under the high-resolution exposure condition, the S-directions of the beam emitting ports of the optical fiber array $FA_1$ and the optical fiber array $FA_2$ are rotated and tilted by a predetermined angle θ (tilt angle θ) using the exposure head tilt angle changing device 24, and the row interval (fiber array interval) between the beam emitting port row of the optical fiber array $FA_1$ and the beam emitting port row of the optical fiber array $FA_2$ in the y-direction is set at an interval "q" that is equal to each of the beam emitting port intervals in the y-direction in the optical fiber array $FA_1$ or the optical fiber array $FA_2$.

In particular, the scanning line intervals under the high-resolution exposure condition is narrower than the scanning line intervals in the scanning line groups under the low-resolution exposure condition. As a result, it is required to construct the multibeam emitting unit 18 with accuracy so that the line intervals between the scanning lines in the scanning line groups do not vary from place to place under the high-resolution exposure condition. This is required to suppress the occurrence of image unevenness.

That is, with the aforementioned multibeam exposure head described in JP 2002-169113 A, under the high-resolution exposure condition, exposure recording is performed by tilting the multibeam emitting unit so that each of scanning lines in the scanning with the multiple beams emitted from the optical fiber array $FA_2$ is positioned at the center between two adjacent scanning lines in the scanning with the multiple beams emitted from the optical fiber array $FA_1$, that is, the recording range in which recording on the recording medium P is performed with the optical fiber array $FA_1$, overlaps the recording range in which recording on the recording medium P is performed with the optical fiber array $FA_2$. As a result, there arises the following problem: If the parallel accuracy between the direction of the beam emitting port row of the optical fiber array $FA_1$ and the direction of the beam emitting port row of the optical fiber array $FA_2$ is not so high, variations occurs in the scanning line intervals and therefore there occurs image unevenness.

In contrast to this, with the multibeam exposure head according to this embodiment, when high-resolution exposure is performed, there is prevented a situation where the recording range in which recording is performed with the multiple beams emitted from the beam emitting ports of the optical fiber array $FA_1$, overlaps the recording range in which recording is performed with the multiple beams emitted from the beam emitting ports of the optical fiber array $FA_2$. Each scanning line of one of the scanning line groups does not enter between scanning lines of the other of the scanning line groups. As a result, it becomes possible to record an image whose unevenness is hardly visually recognized.

As described above, when the low-resolution exposure is performed, each scanning line in the scanning line group of the multiple beams emitted from the optical fiber array $FA_2$ is positioned at the center between two adjacent scanning lines in the scanning line group of the multiple beams emitted from the optical fiber array $FA_1$. As a result, as shown in FIG. 4, the scanning lines are alternately arranged at the beam emitting port intervals of "$D_f/2$".

On the other hand, under the high-resolution exposure condition, the beam emitting ports of the optical fiber array $FA_1$ and the optical fiber array $FA_2$ are arranged so as not to overlap each other in the subscanning direction. That is, the beam emitting ports of the optical fiber array $FA_1$ and the beam emitting ports of the optical fiber array $FA_2$ are continuously arranged in the subscanning direction at the regular intervals. As a result, as shown in FIG. 5, the beam emitting port intervals become "$D_f \cdot \cos θ$".

Accordingly, when exposure recording on the recording material P is performed without changing the imaging magnification of an image using an optical system, the recording pitch ratio between the recording pitch in the subscanning direction under the high-resolution exposure condition and the recording pitch in the subscanning direction under the low-resolution exposure condition becomes "$2 \cdot \cos θ \ (=D_f \cdot \cos θ/(D_f/2))$".

Consequently, when designing the multibeam emitting unit 18, "$2 \cdot \cos θ$" is determined by, for instance, determining the recording pitch or resolution (expressed in units of "dpi") under the low-resolution exposure condition and the recording pitch or resolution under the high-resolution exposure condition. Then, the tilt angle θ is determined using "$2 \cdot \cos θ$". Following this, the arrangements and constructions of the optical fiber array $FA_1$ and the optical fiber array $FA_2$ are determined using the thus determined tilt angle θ.

When the ratio between the two recording pitches or resolutions is set at 0.5, for instance, the tilt angle θ becomes "75.5° ($=\cos^{-1}(0.5/2)$)". Consequently, as shown in FIG. 5, the arrangements and constructions of the optical fiber array $FA_1$ and the optical fiber array $FA_2$ need only be determined so that the tilt angle θ becomes "75.5°". With this construction, it becomes possible to perform switching to an exposure condition for a predetermined resolution without changing the imaging magnification of an image.

Also, when the arrangements and constructions of the optical fiber array $FA_1$ and the optical fiber array $FA_2$ of the multibeam emitting unit 18 are set in advance or are limited and defined in advance, the tilt angle θ of the multibeam emitting unit 18 may be set so that the high-resolution exposure condition described above is satisfied, and the imaging magnification of an image may be adjusted by adjusting the magnification of the imaging lens 22. In addition, a predetermined magnification adjustment lens may be additionally inserted into the optical system, thereby achieving exposure recording of an image at a desired resolution.

Also, in this embodiment, each beam emitting port in the beam emitting port row of the optical fiber array $FA_2$ is positioned at the center between two adjacent beam emitting ports in the beam emitting port row of the optical fiber array $FA_1$ in the arrangement direction of the beam emitting ports of the optical fiber array $FA_1$. In the present invention, however, there arises no problem even if each beam emitting port in the beam emitting port row of the optical fiber array $FA_2$ is not positioned at the center between two adjacent beam emitting ports in the beam emitting port row of the optical fiber array $FA_1$ in the arrangement direction. In this case, it is possible to perform fine adjustment so that each beam emitting port of the optical fiber array $FA_2$ is positioned at the center between two adjacent beam emitting ports of the optical fiber array $FA_1$ in the subscanning direction (y-direction) by rotating the multibeam emitting unit 18 by a minute angle.

Second Embodiment

In the first embodiment described above, a case where the multibeam emitting unit 18 has a dual-stage construction has been described as an example. In a second embodiment of the present invention, however, a more general case where the multibeam emitting unit 18 has a multi-stage construction will be supplementarily described.

Figure 6:
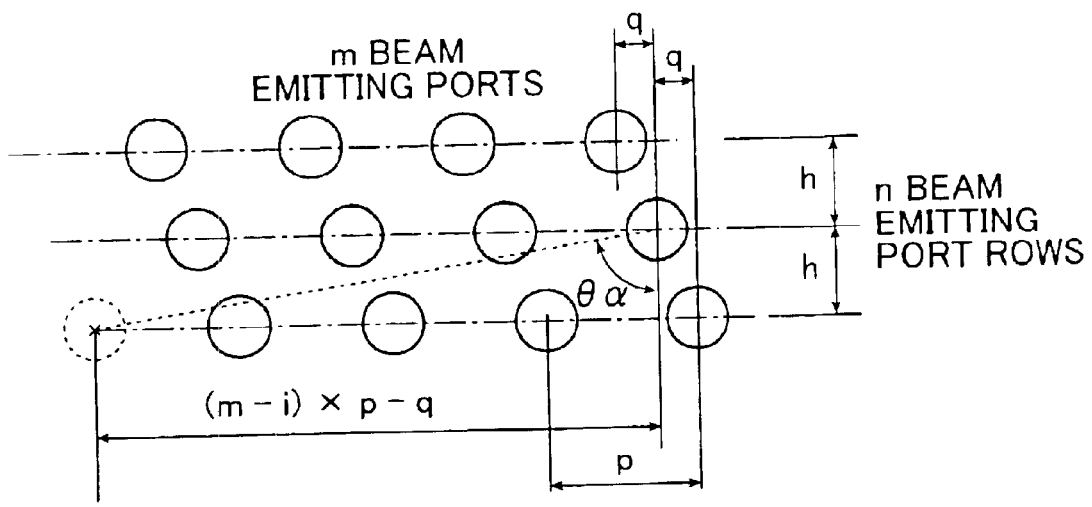
FIG. 6 is a first schematic diagram of a multibeam exposure head according to a second embodiment of the present invention.
Figure 7:
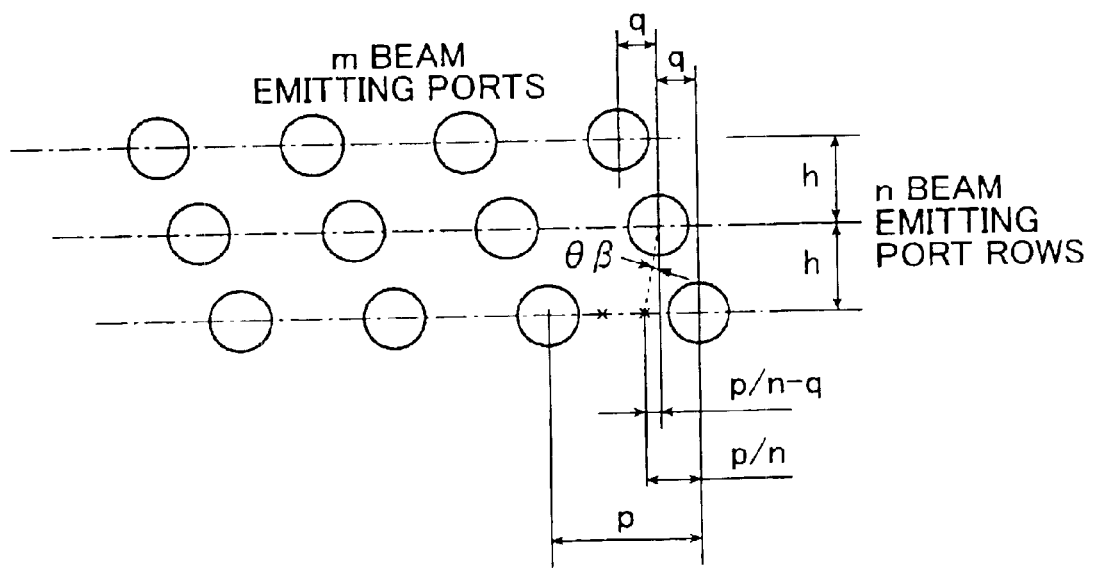
FIG. 7 is a second schematic diagram of the multibeam exposure head according to the second embodiment of the present invention.

FIGS. 6 and 7 each show an essential portion of the multibeam emitting unit 18 in this embodiment. In these drawings, the multibeam emitting unit 18 has a so-called multi-stage construction where n beam emitting port rows (that is, optical fiber arrays) are formed by arranging m beam emitting ports in each row and are disposed parallel to each other. Here, like in the case of the dual-stage construction shown in FIG. 5, the equal intervals between the m beam emitting ports in each row in the arrangement direction (main scanning direction) of the m beam emitting ports are set at "p", and the equal intervals between (i) the beam emitting ports in each of the n beam emitting port rows and (ii) the beam emitting ports in the adjacent beam emitting port rows in the arrangement direction of the beam emitting ports are set at "q".

When the multibeam emitting unit is set at a tilt angle "θα" as shown in FIG. 6, the tilt angle "θα" is set so that an image having a predetermined resolution is recorded with the first optical fiber array formed by the m beam emitting ports. Then, assuming that the number of overlapping lines is "i" when recording lines from one optical fiber array and recording lines from the next optical fiber array overlap each other, the relationship among the arrangement parameters "p", "q", "h", and "i" of the optical fiber arrays is expressed as follows.

$$\tan θα=((m-1)×p-q)/h \qquad (2)$$

Also, in the case of the tilt angle θβ shown in FIG. 7, the tilt angle θβ is set so that an image whose resolution is 1/n of a target resolution, is recorded with the first optical fiber array formed by the m beam emitting ports, and each optical fiber array from the second optical fiber array to the n-th optical fiber array records one of lines found by dividing the pitch "p" of the first optical fiber array by "n".

In this case, the relationship among the arrangement parameters "p", "q", and "h" of the optical fiber arrays is expressed as follows.

$$\tan θβ=(p/n-q)/h \qquad (3)$$

With the multi-stage construction in which the n beam emitting port rows are formed by arranging the m beam emitting ports in each row so that the relationships among the optical fiber array arrangement parameters "p", "q", and "h" are satisfied, it is possible to perform switching of the recording resolution by performing switching between the tilt angles "θα" and "θβ".

Also, in the multibeam exposure head according to this embodiment, when high-resolution exposure is performed, there is prevented a situation where each recording range in which recording is performed with multiple beams emitted from the beam emitting ports of one of the optical fiber arrays, and other recording ranges in which recording is performed with multiple beams emitted from the beam emitting ports of other optical fiber arrays, overlap each other. Consequently, the scanning lines in each scanning line group do not enter between the scanning lines in other scanning line groups. As a result, there is provided an effect that image unevenness is hardly visually recognized.

EXAMPLE

Hereinafter, a concrete example will be described. Note that in this example, it is assumed that exposure is performed using a multibeam exposure apparatus in which n beam emitting port rows are formed by arranging m beam emitting ports in each row under conditions of "m=8", "n=2", "p=127 μm", "q=60 μm", "i=1", and "K (ratio between switchable resolutions)=2".

Equation (4) shown below is obtained from Equation (1).

$$4×\cos θα=\cos θβ \qquad (4)$$

Also, Equation (5) shown below is obtained from Equation (2).

$$\tan θα=((8-1)×127-60)/h=829/h \qquad (5)$$

Further, Equation (6) shown below is obtained from Equation (3).

$$\tan θβ=(127/2-60)/h=3.5/h \qquad (6)$$

From Equations (4), (5), and (6) described above, "θα", "θβ", and "h" become "76.4 degrees", "1.0 degree", and "201 μm", respectively.

Figure 8:
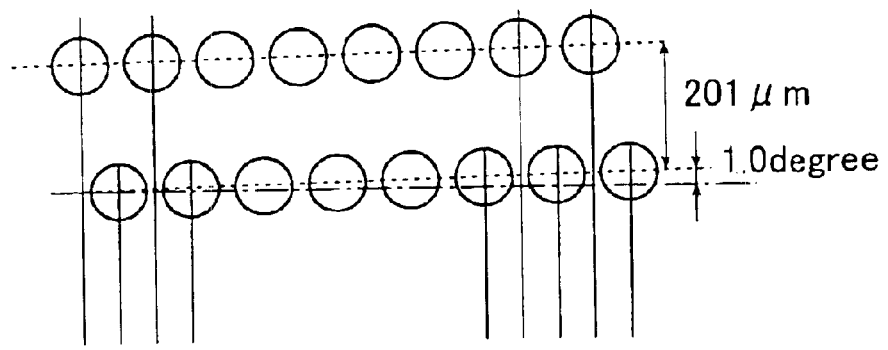
FIG. 8 is an explanatory diagram showing a state where a multibeam exposure head according to an example of the present invention is set at a tilt angle for low-resolution recording.

In the case of the low-resolution tilt angle "θβ=1.0 degree (approximately horizontal)" (see FIG. 8), there is obtained an arrangement where each beam from one of the two optical fiber arrays enters between two adjacent beams from the other of the two optical fiber arrays. In this case, there is obtained an approximately horizontal arrangement, so that even if errors to some degree occur in the parallel degree between the two optical fiber arrays, the parallel degree errors rarely cause a problematic recording pitch error.

Figure 9:
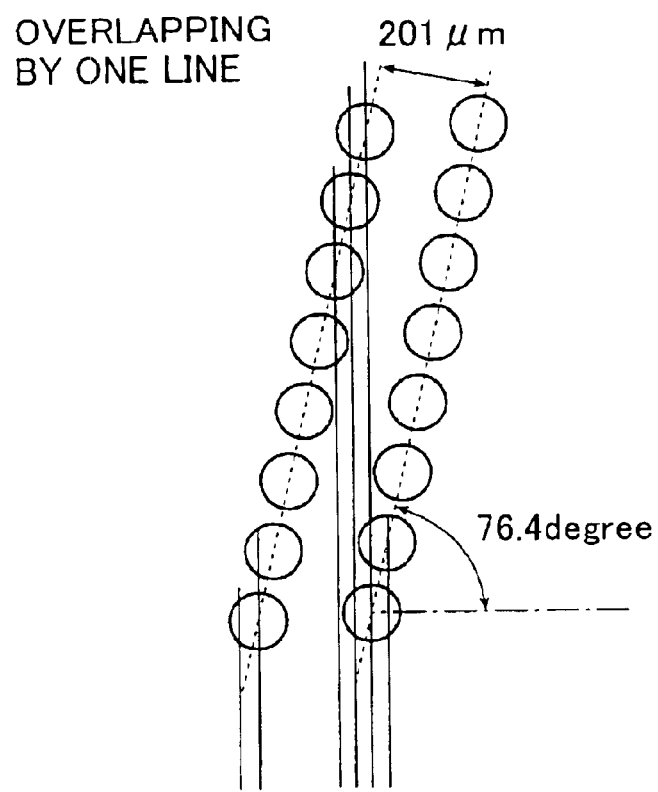
FIG. 9 is an explanatory diagram showing a state where the multibeam exposure head is set at a tilt angle for high-resolution recording.

Also, in the case of the high-resolution tilt angle "θα=76.4 degrees" (see FIG. 9), the beams from one of the two optical fiber arrays do not enter between the beams from the other of the two optical fiber arrays and are arranged next to the beams from the other optical fiber array. In this example, setting has been made so that there occurs overlapping by one line. As a result, even if errors to some degree occur in the parallel degree between the optical fiber arrays, its influence on a recording pitch error is reduced and therefore there hardly occurs image unevenness.

The effect achieved with the multibeam exposure heads described in the embodiments is that there is obtained an array construction which can suppress image unevenness due to errors in the parallel degree caused between multiple optical fiber arrays of a multi-stage construction and which further facilitates resolution switching.

It should be noted here that in each embodiment described above, respective optical fiber arrays constituting the multi-stage construction have the same number of beam emitting ports. In the present invention, however, the respective optical fiber arrays are not necessarily required to have the same number of beam emitting ports and there arises no problem even if they have different numbers of beam emitting ports.

The multibeam exposure head and the multibeam recording method according to the present invention have been described in detail above, but the present invention is not limited to the embodiments described above, and it is of course possible to make various modifications and changes without departing from the gist of the present invention.

As described in detail above, according to the present invention, it is possible to freely perform switching between a high-resolution condition and a low-resolution condition. Also, at the time of high-resolution condition, the directions of the beam emitting port rows are adjusted so that multiple recording ranges in which recording is performed with multiple beams emitted from the multiple beam emitting port rows, do not overlap each other. Consequently, even if errors to some degree occur in the parallel accuracy between the multiple beam emitting port rows arranged parallel to each other, it is possible to suppress variations in the intervals between the beam emitting ports of the beam emitting port rows (line intervals in scanning line groups) in the subscanning direction. As a result, variations in a recording pitch are suppressed, and therefore it becomes possible to suppress the occurrence of image unevenness at the time of image recording.

Also, it is not required to set the parallel degree between the beam emitting port rows of the multiple optical fiber arrays with high accuracy, so that it becomes possible to simplify the construction of the beam emitting unit and to achieve cost reduction. Further, it is possible to change the directions of the multiple beam emitting port rows of the multibeam exposure head by changing the tilt angle of the beam emitting port rows with respect to the subscanning direction. As a result, it becomes possible to change the resolution of an image to be recorded on a recording material by exposure. In addition, when an optical system that adjusts the imaging magnification of an image is used, it becomes possible to perform adjustment so that exposure recording is performed at a predetermined resolution.

What is claimed is:

1. A multibeam exposure head that performs exposure recording on a recording material that is relatively moved in a main scanning direction, comprising:
    a beam emitting unit having a plurality of beam emitting port rows each of which is formed by arranging a plurality of beam emitting ports at a predetermined interval in a row; and
    an angle changing unit that changes a tilt angle of a row direction of said plurality of beam emitting port rows of said beam emitting unit with respect to a subscanning direction that is perpendicular to a beam emitting direction and said main scanning direction,
    wherein said angle changing unit has a function of performing switching between a first exposure recording mode and at least one other exposure recording mode,
    wherein said first exposure recording mode performs said exposure recording by setting said tilt angle at a first angle in such a way that a first scanning line group having a predetermined line interval and being formed on said recording material by multiple beams emitted from one of said plurality of beam emitting port rows, and at least one other scanning line group having the same line interval as said predetermined line interval and being formed on said recording material by multiple beams emitted from at least one other row of remainders of said plurality of beam emitting port rows are spaced apart from each other without superimposing, and each distance between adjacent scanning line groups becomes substantially equal to said predetermined line interval, and
    wherein said at least one other exposure recording mode performs said exposure recording by setting said tilt angle at at least one other angle different from said first angle in such a way that each scanning line in said at least one other scanning line group enters between adjacent scanning lines in said first scanning line group, and a line interval in a total scanning line group formed by said at least one other scanning line group and said first scanning line group become a substantially equal interval.

2. The multibeam exposure head according to claim 1, wherein said first angle is set larger than said at least one other angle.

3. The multibeam exposure head according to claim 1, wherein a recording resolution in said first exposure recording mode is set higher than a recording resolution in said at least one other exposure recording mode.

4. The multibeam exposure head according to claim 1, further comprising:
    an optical system that converges said multiple beams emitted from said beam emitting unit on said recording material and adjusts an imaging magnification of an image to be recorded by said exposure recording.

5. The multibeam exposure head according to claim 1, wherein said beam emitting unit is constructed using optical fiber arrays.

6. The multibeam exposure head according to claim 1, wherein said beam emitting unit has a first beam emitting port row and a second beam emitting port row as said plurality of beam emitting port rows, and said one of said plurality of beam emitting port rows is said first beam emitting port row and said at least one other row of remainders of said plurality of beam emitting port rows is said second beam emitting port row,
    wherein said first scanning line group is formed on said recording material by the multiple beams emitted from said first beam emitting port row and said at least one other scanning line group is a second scanning line group being formed on said recording material by the multiple beams emitted from said second beam emitting port row, and said first exposure recording mode performs said exposure recording by setting said tilt angle at said first angle in such a way that said first scanning line group and said second scanning line group are spaced apart from each other without superimposing, and each distance between adjacent scanning line groups becomes substantially equal to said predetermined line interval, and wherein said total scanning line group is formed by said first scanning line group and said second scanning line group such that each scanning line in said second scanning line group enters between adjacent scanning lines in said first scanning line group and said at least one other angle different from said first angle is a second angle, and said at least one other exposure recording mode is a second exposure recording mode performing said exposure recording by setting said tilt angle at said second angle in such a way that and the line interval in said total scanning line group become the substantially equal interval, and wherein said angle changing unit has the function of performing switching between said first exposure recording mode and said second exposure recording mode.

7. The multibeam exposure head according to claim 6, wherein said first angle is set larger than said second angle.

8. The multibeam exposure head according to claim 6, wherein a recording resolution in said first exposure recording mode is set higher than a recording resolution in said second exposure recording mode.

9. A multibeam exposure head that performs exposure recording on a recording material that is relatively moved in a main scanning direction, comprising:

a beam emitting unit having a plurality of beam emitting port rows that are arranged parallel to each other, each beam emitting port row being formed by arranging a plurality of beam emitting ports at a predetermined interval in a row; and an angle changing unit that changes a tilt angle of a row direction of each beam emitting port row of said beam emitting unit with respect to a subscanning direction that is perpendicular to a beam emitting direction and said main scanning direction, wherein said angle changing unit is a switching unit that performs switching between two exposure recording modes having different recording resolutions based on Equation (1) given below, $$n \times (\cos \theta\alpha) \times K = \cos \theta\beta \quad (1)$$

where n is a number of said plurality of beam emitting port rows, $\theta\alpha$ is said tilt angle of said row direction of said beam emitting unit corresponding to a first recording resolution, $\theta\beta$ is said tilt angle of said row direction of said beam emitting unit corresponding to a second recording resolution, and K is a ratio between said first recording resolution and said second recording resolution.

10. The multibeam exposure head according to claim 9, wherein said angle changing unit sets said tilt angle of said row direction of said beam emitting unit at one of "$\theta\alpha$" and "$\theta\beta$" that respectively satisfy relationships expressed by Equations (2) and (3) given below, $$\tan \theta\alpha = ((m-1) \times p - q)/h \quad (2)$$

$$\tan \theta\beta = (p/n - q)/h \quad (3)$$

where m is a number of said plurality of beam emitting ports in each beam emitting port row of said beam emitting unit, n is a number of said plurality of beam emitting port rows, p is an equal interval between said plurality of beam emitting ports in each row in a direction in which said plurality of beam emitting ports are arranged, h is an equal interval between said plurality of beam emitting port rows in a direction in which said plurality of beam emitting port rows are arranged, q is an equal interval between said plurality of beam emitting ports in each beam emitting port row and said plurality of beam emitting ports in its adjacent beam emitting port rows in the arrangement direction of said plurality of beam emitting ports, and i is a number of lines by which overlapping of scanning lines for exposure recording occurs.

11. The multibeam exposure head according to claim 9, further comprising:

an optical system that converges multiple beams emitted from said beam emitting unit on said recording material and adjusts an imaging magnification of an image to be recorded by said exposure recording.

12. The multibeam exposure head according to claim 9, wherein said beam emitting unit is constructed using optical fiber arrays.

13. A multibeam exposure head that performs exposure recording on a recording material that is relatively moved in a main scanning direction, comprising:

a beam emitting unit having a first beam emitting port row in which a plurality of beam emitting ports are arranged at a predetermined interval in a row, and a second beam emitting port row in which a plurality of beam emitting ports are arranged at the same interval in a row along said first beam emitting port row; and an angle changing unit that changes a tilt angle of a row direction of said first beam emitting port row and said second beam emitting port row with respect to a subscanning direction that is perpendicular to a beam emitting direction and said main scanning direction, wherein said angle changing unit has a function of performing switching between a first exposure recording mode and a second exposure recording mode, wherein said first exposure recording mode performs said exposure recording by setting said tilt angle at a first angle in such a way that a first scanning line group having a predetermined line interval and being formed on said recording material by multiple beams emitted from said first beam emitting port row, and a second scanning line group having the same line interval as said predetermined line interval and being formed on said recording material by multiple beams emitted from said second beam emitting port row are spaced apart from each other without superimposing, and each distance between adjacent scanning line groups becomes substantially equal to said predetermined line interval, and wherein said second exposure recording mode performs said exposure recording by setting said tilt angle at a second angle different from said first angle in such a way that each scanning line in said second scanning line group enters between adjacent scanning lines in said first scanning line group, and a line interval in a third scanning line group formed by said first scanning line group and said second scanning line group become a substantially equal interval.

14. A multibeam recording method that uses a multibeam exposure head that performs exposure recording on a recording material that is relatively moved in a main scanning direction and comprises: a beam emitting unit having a plurality of beam emitting port rows each of which is formed by arranging a plurality of beam emitting ports at a predetermined interval in a row; and an angle changing unit that changes a tilt angle of a row direction of said plurality of beam emitting port rows of said beam emitting unit with respect to a subscanning direction that is perpendicular to a beam emitting direction and said main scanning direction, said method comprising:

changing said tilt angle of said beam emitting unit using said angle changing unit to obtain a predetermined recording resolution; and performing said exposure recording at said predetermined recording resolution, wherein said angle changing unit has a function of performing switching between a first exposure recording mode and at least one other exposure recording mode, wherein said first exposure recording mode performs said exposure recording by setting said tilt angle at a first angle in such a way that a first scanning line group having a predetermined line interval and being formed on said recording material by multiple beams emitted from one of said plurality of beam emitting port rows, and at least one other scanning line group having the same line interval as said predetermined line interval and being formed on said recording material by multiple beams emitted from at least one other row of remainders of said plurality of beam emitting port rows are spaced apart from each other without superimposing, and each distance between adjacent scanning line groups becomes substantially equal to said predetermined line interval, and wherein said at least one other exposure recording mode performs said exposure recording by setting said tilt angle at at least one other angle different from said first angle in such a way that each scanning line in said at least one other scanning line group enters between adjacent scanning lines in said first scanning line group, and a line interval in a total scanning line group formed by said at least one other scanning line group and said first scanning line group become a substantially equal interval.

15. A multibeam recording method that uses a multibeam exposure head that performs exposure recording on a recording material that is relatively moved in a main scanning direction and comprises: a beam emitting unit having a plurality of beam emitting port rows that are arranged parallel to each other, each beam emitting port row being formed by arranging a plurality of beam emitting ports at a predetermined interval in a row; and an angle changing unit that changes a tilt angle of a row direction of each beam emitting port row of said beam emitting unit with respect to a subscanning direction that is perpendicular to a beam emitting direction and said main scanning direction, said method comprising:

changing said tilt angle of said beam emitting unit using said angle changing unit to obtain a predetermined recording resolution; and performing said exposure recording at said predetermined recording resolution, wherein said angle changing unit is a switching unit that performs switching between two exposure recording modes having different recording resolutions based on Equation (1) given below, $$n \times (\cos \theta\alpha) \times K = \cos \theta\beta \quad (1)$$

where n is a number of said plurality of beam emitting port rows, $\theta\alpha$ is said tilt angle of said row direction of said beam emitting unit corresponding to a first recording resolution, $\theta\beta$ is said tilt angle of said row direction of said beam emitting unit corresponding to a second recording resolution, and K is a ratio between said first recording resolution and said second recording resolution.

* * * * *